(12) United States Patent
Shuto

(10) Patent No.: US 6,934,179 B2
(45) Date of Patent: Aug. 23, 2005

(54) SEMICONDUCTOR INTEGRATED CIRCUIT DEVICE AND BIT LINE CAPACITANCE ADJUSTING METHOD USING THE DEVICE

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/917,299

(22) Filed: Aug. 13, 2004

(65) Prior Publication Data

US 2005/0152173 A1 Jul. 14, 2005

(30) Foreign Application Priority Data

Jan. 9, 2004 (JP) .............................. 2004-004554

(51) Int. Cl.[7] .............................................. G11C 11/22
(52) U.S. Cl. .................. 365/145; 365/225.7; 365/201; 365/189.09; 365/202; 716/2
(58) Field of Search ............................ 365/145, 225.7, 365/201, 189.09, 202, 204; 716/1, 2, 4

(56) References Cited

U.S. PATENT DOCUMENTS

| | | | | |
|---|---|---|---|---|
| 5,038,323 A | * | 8/1991 | Schwee ....................... | 365/145 |
| 5,270,967 A | * | 12/1993 | Moazzami et al. ......... | 365/145 |
| 6,451,665 B1 | * | 9/2002 | Yunogami et al. ........... | 438/397 |
| 6,560,138 B2 | * | 5/2003 | Noro et al. .................. | 365/145 |
| 2003/0185085 A1 | * | 10/2003 | Kaneko .................. | 365/230.03 |

FOREIGN PATENT DOCUMENTS

| | | | | |
|---|---|---|---|---|
| JP | 6-342597 | 12/1994 | ........... | G11C 14/00 |
| JP | 9-139090 | 5/1997 | ........... | G11C 14/00 |
| JP | 2000-90674 | 3/2000 | ........... | G11C 14/00 |

* cited by examiner

Primary Examiner—Andrew Q. Tran
(74) Attorney, Agent, or Firm—Oblon, Spivak, McClelland, Maier & Neustadt, P.C.

(57) ABSTRACT

A semiconductor integrated circuit device includes a first transistor which has first source and drain and a first gate, a ferro-electric capacitor which is connected to one of the first source and drain, a bit line which is connected to the other of the first source and drain, at least one capacitor connected to the bit line, and a control circuit which electrically connects the capacitor to the bit line or electrically disconnects the capacitor from the bit line.

22 Claims, 4 Drawing Sheets

SEMICONDUCTOR INTEGRATED CIRCUIT DEVICE AND BIT LINE CAPACITANCE ADJUSTING METHOD USING THE DEVICE

CROSS-REFERENCE TO RELATED APPLICATIONS

This application is based upon and claims the benefit of priority from prior Japanese Patent Application No. 2004-004554, filed Jan. 9, 2004, the entire contents of which are incorporated herein by reference.

BACKGROUND OF THE INVENTION

1. Field of the Invention

The present invention relates to a semiconductor integrated circuit device having a ferro-electric capacitor and a bit line capacitance adjusting method using the device and, more particularly, to a semiconductor integrated circuit device which optimizes the bit line capacitance and a bit line capacitance adjusting method using the device.

2. Description of the Related Art

Ferro-electric memories (FeRAMs) using ferro-electric capacitors have recently been receiving a great deal of attention as nonvolatile semiconductor memories.

A memory cell of an FeRAM is formed from a cell transistor Trc and a ferro-electric capacitor Cf, as shown in FIG. 6. One of the source and drain of the cell transistor Trc is connected to a bit line BL, and the other is connected to one electrode of the ferro-electric capacitor Cf. The other electrode of the ferro-electric capacitor Cf is connected to a plate line PL. The bit line BL has a parasitic bit line capacitance Cb.

In this FeRAM, data is written or read by using the hysteresis characteristic of the ferro-electric material that forms the ferro-electric capacitor Cf.

FIG. 7 shows the hysteresis characteristic of the ferro-electric capacitor Cf. The abscissa of this graph indicates a voltage Vf applied to the ferro-electric capacitor Cf. The ordinate indicates a charge amount Q. Straight lines L1 and L2 indicate the characteristic of the bit line capacitance Cb. As the value of the bit line capacitance Cb decreases, the gradient of the straight lines L1 and L2 becomes small.

In the ferro-electric capacitor Cf, even when the applied voltage Vf is 0V, polarization remains at points A and C. Point A indicates the polarization state for data "0". Point C indicates the polarization state for data "1".

Data written in the memory cell can be read by checking the polarization state of the ferro-electric capacitor Cf.

First, the bit line BL is set in a floating state. Then, a read potential is applied to the plate line PL. The voltage generated across the ferro-electric capacitor Cf at this time is measured.

When the ferro-electric capacitor Cf is in the polarization state at the point A, it is shifted to the state at a point E in consideration of the bit line capacitance Cb by the straight line L1. The voltage Vf generated across the ferro-electric capacitor Cf is V0. On the other hand, when the ferro-electric capacitor Cf is in the polarization state at the point C, it is shifted to the state at a point F in consideration of the bit line capacitance Cb by the straight line L2. The voltage Vf generated across the ferro-electric capacitor Cf is V1. When a reference voltage Vref is set in advance, the polarization state of the ferro-electric capacitor Cf can be checked by comparing the reference voltage Vref with the voltage Vf generated across the ferro-electric capacitor Cf in the read. In the above-described way, "1" and "0" data are discriminated.

The value of the bit line capacitance Cb indicated by the straight lines L1 and L2 is decided by the cell array structure (circuit arrangement) and manufacturing process of each device. That is, once the cell array structure and manufacturing process are decided, and a chip is manufactured, its bit line capacitance Cb cannot be optimized further. In addition, the device incorporates no circuit capable of changing the bit line capacitance Cb after manufacturing. Conventionally, since the bit line capacitance Cb after manufacturing is not changeable, the following problems are posed.

FIG. 8 shows the relationship between the bit line capacitance Cb and a signal margin Vm. The signal margin Vm is the voltage difference |V1−V0| between "1" and "0" data. The signal margin Vm is also called a "bit line signal window".

The relationship between the bit line capacitance Cb and the signal margin Vm changes depending on the size or hysteresis shape of the ferro-electric capacitor Cf. The "designed curve" shown in FIG. 8 is a curve when a typical hysteresis shape and a certain size of the ferro-electric capacitor Cf are assumed. In actually, for example, the "actual curve" shown in FIG. 8 is obtained because the curve changes depending on the product or lot.

As shown in FIG. 8, the signal margin Vm generally takes a maximum value at a certain bit line capacitance Cb. Normally, the optimum value of the bit line capacitance Cb is roughly predicted on the basis of the size of the ferro-electric capacitor Cf to be used for a product or predicted hysteresis shape. The cell array is assembled such that the optimum value is obtained. However, the manufacturing process has some fluctuation. For this reason, in an actually manufactured chip, the bit line capacitance Cb does not always have the predetermined optimum value.

When a chip is manufactured in consideration of the optimally designed bit line capacitance Cb in FIG. 8, the signal margin Vm of about 1,000 mV should be ensured. Actually, however, the signal margin Vm is only about 500 mV.

As described above, in the prior art, the bit line capacitance Cb cannot be optimized after manufacturing a device. For this reason, some chips may be unable to ensure the signal margin Vm that should be obtained. They may be defective or cannot ensure long-term reliability.

Prior art related to this application is, for example, Jpn. Pat. Appln. KOKAI Publication No. 6-342597.

BRIEF SUMMARY OF THE INVENTION

According to a first aspect of the present invention, a semiconductor integrated circuit device comprises a first transistor which has first source and drain and a first gate, a ferro-electric capacitor which is connected to one of the first source and drain, a bit line which is connected to the other of the first source and drain, at least one capacitor connected to the bit line, and a control circuit which electrically connects the capacitor to the bit line or electrically disconnects the capacitor from the bit line.

According to a second aspect of the present invention, a bit line capacitance adjusting method using a semiconductor integrated circuit device comprising a first transistor which has first source and drain and a first gate, a ferro-electric capacitor which is connected to one of the first source and drain, a bit line which is connected to the other of the first source and drain, at least one capacitor connected to the bit line, and a control circuit which electrically connects the capacitor to the bit line or electrically disconnects the capacitor from the bit line, comprises designing the semiconductor integrated circuit device in which a maximum bit line capacitance when all the capacitors are electrically connected to the bit line and a minimum bit line capacitance when all the capacitors are electrically disconnected from the bit line fall within a predetermined range of an optimum value of a bit line capacitance, manufacturing the semiconductor integrated circuit device on the basis of the design, testing the semiconductor integrated circuit device to find the optimum value of the bit line capacitance, and electrically connecting the capacitors to the bit line or disconnecting the capacitors from the bit line so as to obtain the optimum value of the bit line capacitance, by adjusting the bit line capacitance.

DETAILED DESCRIPTION OF THE INVENTION

Figure 1:
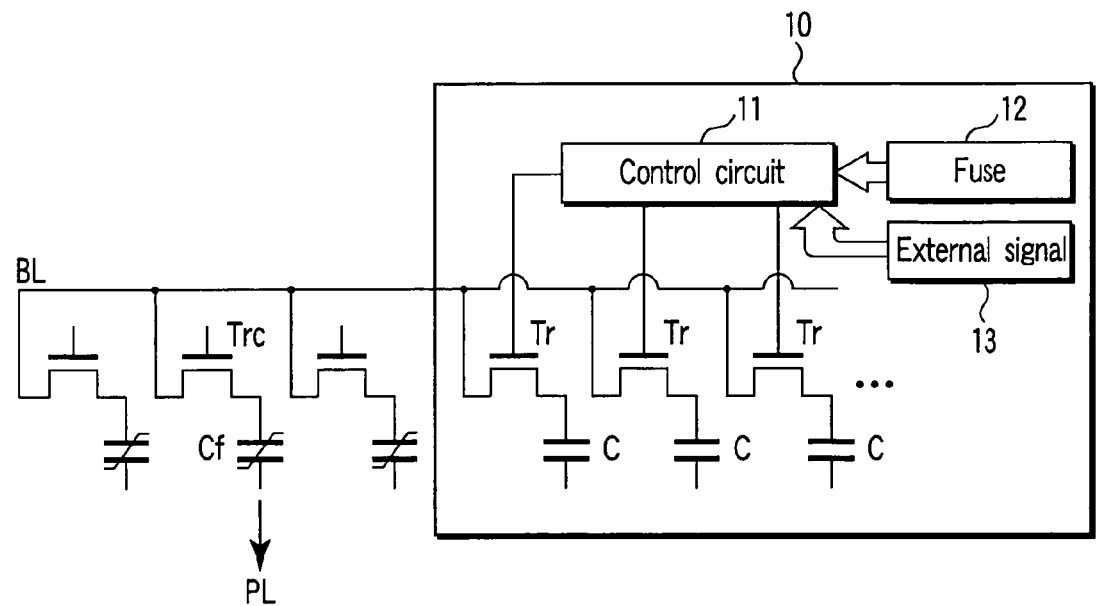
FIG. 1 is a schematic circuit diagram showing a semiconductor integrated circuit device according to the first embodiment of the present invention.

The embodiments of the present invention will be described below with reference to the accompanying drawing. In the following description, the same reference numerals denote the same parts throughout the drawing.

First Embodiment

In the first embodiment, to change a bit line capacitance Cb after a product test upon manufacturing a product, an additional capacitance is prepared for each bit line. The capacitance is disconnected or connected by using, e.g., a transistor.

FIG. 1 is a schematic circuit diagram of a semiconductor integrated circuit device according to the first embodiment of the present invention. A memory cell is formed from a cell transistor Trc and a ferro-electric capacitor Cf, as shown in FIG. 1. One of the source and drain of the cell transistor Trc is connected to a bit line BL, and the other is connected to one electrode of the ferro-electric capacitor Cf. The other electrode of the ferro-electric capacitor Cf is connected to a plate line PL.

A bit line capacitance adjusting circuit 10 is connected to the bit line BL. The bit line capacitance adjusting circuit 10 has transistors Tr, additional capacitors C, and a control circuit 11. One of the source and drain of each transistor Tr is connected to the bit line BL. The other of the source and drain is connected to one electrode of a corresponding additional capacitor C. The gate is connected to the control circuit 11. The bit line capacitance adjusting circuit 10 preferably has at least one pair of a transistor Tr and an additional capacitor C.

In the bit line capacitance adjusting circuit 10, the control circuit 11 turns on/off the transistors Tr in accordance with a fuse 12 or an external signal 13 from a test circuit arranged outside the cell array (e.g., outside the chip). As a result, the additional capacitors C are electrically connected to or disconnected from the bit line BL so that the capacitances of the additional capacitors C can be added to or removed from the bit line capacitance Cb.

As the additional capacitor C, for example, a gate capacitor formed by a normal CMOS process can be used. The transistor Tr preferably has the same structure as that of the cell transistor Trc in the memory cell.

Figure 2:
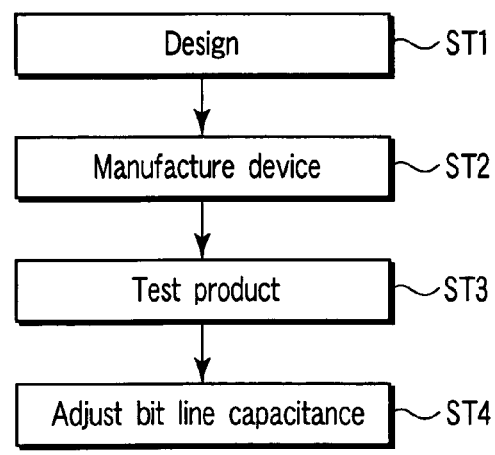
FIG. 2 is a flow chart showing a bit line capacitance adjusting method using the semiconductor integrated circuit device according to the first embodiment of the present invention.

FIG. 2 is a flow chart of a bit line capacitance adjusting method according to the first embodiment of the present invention. A method of adjusting the bit line capacitance Cb by using the bit line capacitance adjusting circuit 10 will be described below. When the bit line capacitance adjusting circuit 10 is used, the bit line capacitance Cb is the sum of the original capacitance of the bit line itself and the capacitances of the additional capacitors.

Before manufacturing of a semiconductor integrated circuit device, design is done in the following way (ST1). The bit line capacitance Cb when none of the additional capacitors C are operated is designed to be slightly smaller than the optimum value that is predicted from the typical hysteresis shape. The bit line capacitance Cb when all the additional capacitors C are operated is designed to be slightly larger than the optimum value predicted from the typical hysteresis shape. When the additional capacitors C are operated, the range near the predicted optimum value of the bit line capacitance Cb can be covered.

A process variation of about 10% is taken into consideration. If a range of ±10% (range width: 20%) of the predicted optimum value of the bit line capacitance Cb should be covered, for example, several to five additional capacitors C are preferably prepared for each bit line BL. When five additional capacitors C are prepared, the capacitance of each additional capacitor C is about 4% to 5% of the bit line capacitance Cb.

The larger the number of prepared additional capacitors C becomes, the finer the bit line capacitance Cb can be adjusted. However, this leads to an increase in occupation area of the additional capacitors C. The number of the additional capacitors C is adjusted in accordance with required device performance.

Next, a semiconductor integrated circuit device having the bit line capacitance adjusting circuit 10 is manufactured on the basis of the above design (ST2).

The manufactured product is tested (ST3). In this test, the optimum value of the bit line capacitance Cb, which has varied due to variation in the manufacturing process, is obtained by using the bit line capacitance adjusting circuit 10.

More specifically, the control circuit 11 is driven by the fuse 12 or the external signal 13 from the test circuit. The control circuit 11 applies a predetermined voltage to the gate of the transistor Tr to open/close it. When the gate of the transistor Tr is turned on, the additional capacitor C is connected to increase the bit line capacitance Cb. When the gate of the transistor Tr is turned off, the additional capacitor C is disconnected to decrease the bit line capacitance Cb. In this way, some additional capacitors C are connected or disconnected, thereby finding the optimum value of the bit line capacitance Cb.

Figure 3:
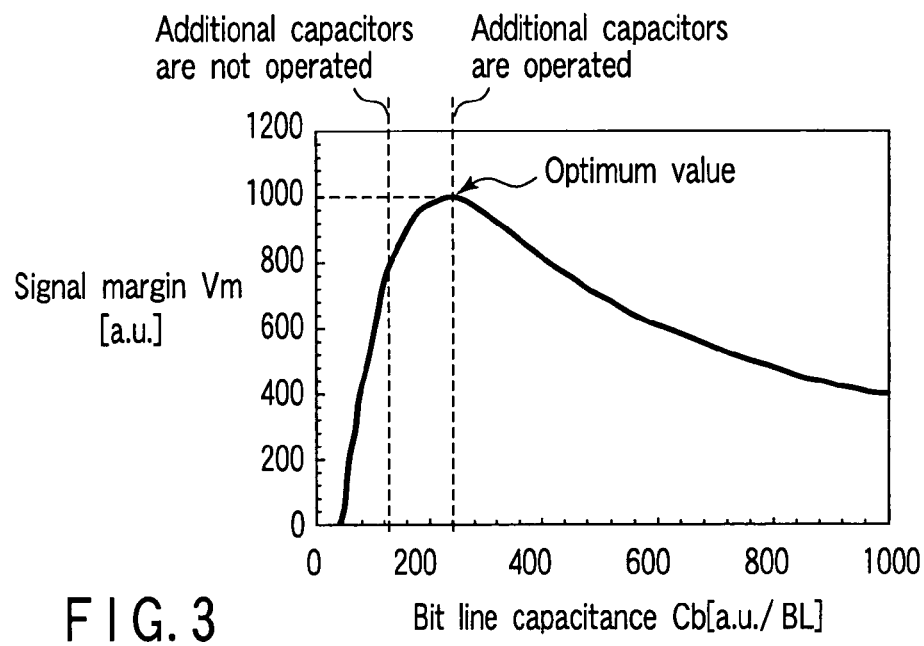
FIG. 3 is a graph showing the relationship between the bit line capacitance and the signal margin according to the first embodiment of the present invention.

As an index used to find the optimum value of the bit line capacitance Cb, for example, a signal margin (the signal amount of the bit line) Vm between "1" and "0" data can be used. For example, the manner in which the signal margin Vm of a certain bit line BL changes in accordance with ON/OFF of the additional capacitors C is checked. For example, a product having a curve shown in FIG. 3 cannot obtain the signal margin Vm with the maximum value (optimum value) without operating the additional capacitors C. To increase the bit line capacitance Cb, some additional capacitors C are operated to obtain the signal margin Vm with the maximum value. In this way, the ON/OFF state of the additional capacitors C with which the bit line capacitance Cb has the optimum value is checked such that the signal margin Vm having the maximum value is obtained.

The result of the signal margin Vm of only one bit line BL may be an exceptional result. To increase the reliability of the obtained optimum value of the bit line capacitance Cb, the same test as described above is preferably executed for a plurality of bit lines BL without taking a long test time.

As another index, for example, the number of defective products when the bit line capacitance Cb is changed may be used. In this case, if a normal test is employed, the number of defective products may be too small to be an index. Hence, a slightly strict test is executed by changing the test parameters.

On the basis of the information of the optimum value of the bit line capacitance Cb, which is obtained by the above test, control is performed by the fuse 12 or external signal 13 such that at least some of the additional capacitors C are turned on in a normal use state. In this way, the bit line capacitance Cb is adjusted (ST4).

According to the first embodiment, the bit line capacitance adjusting circuit 10 is added to the bit line BL. After manufacturing a device, the bit line capacitance Cb can be changed by connecting or disconnecting the additional capacitors C. With this arrangement, even when the manufacturing process varies, the bit line capacitance Cb in each chip can be adjusted in accordance with variation in the manufacturing process after manufacturing the product. Since the bit line capacitance Cb can be more finely optimized than a prior-art FeRAM, the signal margin can be maximized. When this technique is used, the yield and reliability can be increased.

In the bit line capacitance adjusting circuit 10, the transistor Tr is used as a switching element that connects or disconnects the capacitor C. However, the present invention is not limited to this.

Figure 4:
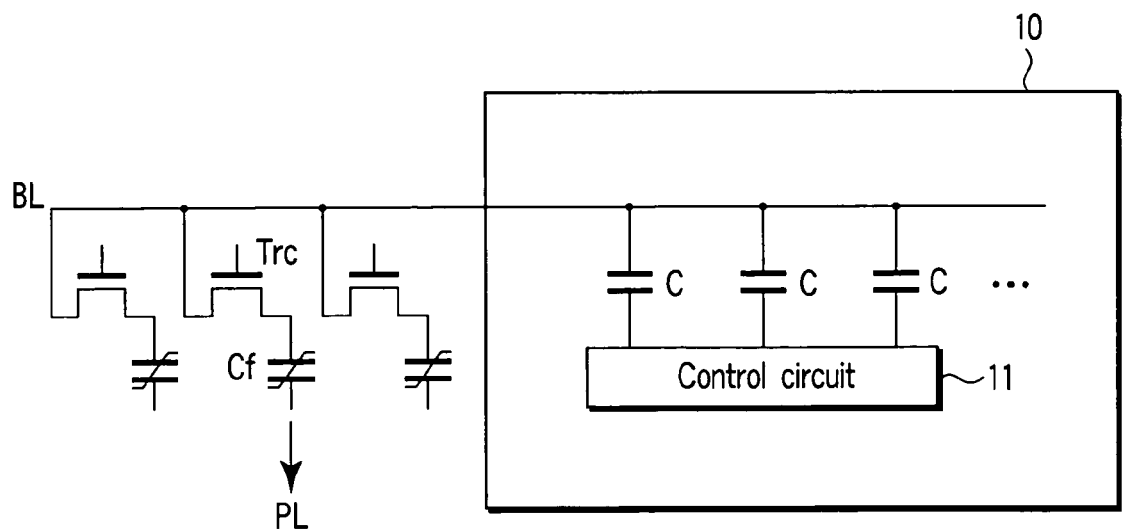
FIG. 4 is a schematic circuit diagram showing another semiconductor integrated circuit device according to the first embodiment of the present invention.

The capacitor C may be connected or disconnected without using any switching element such as the transistor Tr. For example, as shown in FIG. 4, one electrode of the capacitor C is connected to the bit line BL. The other electrode is connected to the control circuit 11 so that the electrode of the capacitor C on the opposite side of the bit line BL becomes changeable. When the potential of one of the electrodes of the capacitor C is adjusted by the control circuit 11, the capacitor C can be connected or disconnected.

Second Embodiment

In the second embodiment, the bit line capacitance Cb is changed by a method different from that of the first embodiment. A double structure of an n-well and p-well is formed. A voltage is applied to the p-well to change the capacitance of the p-n junction, thereby adjusting the bit line capacitance Cb.

Figure 5:
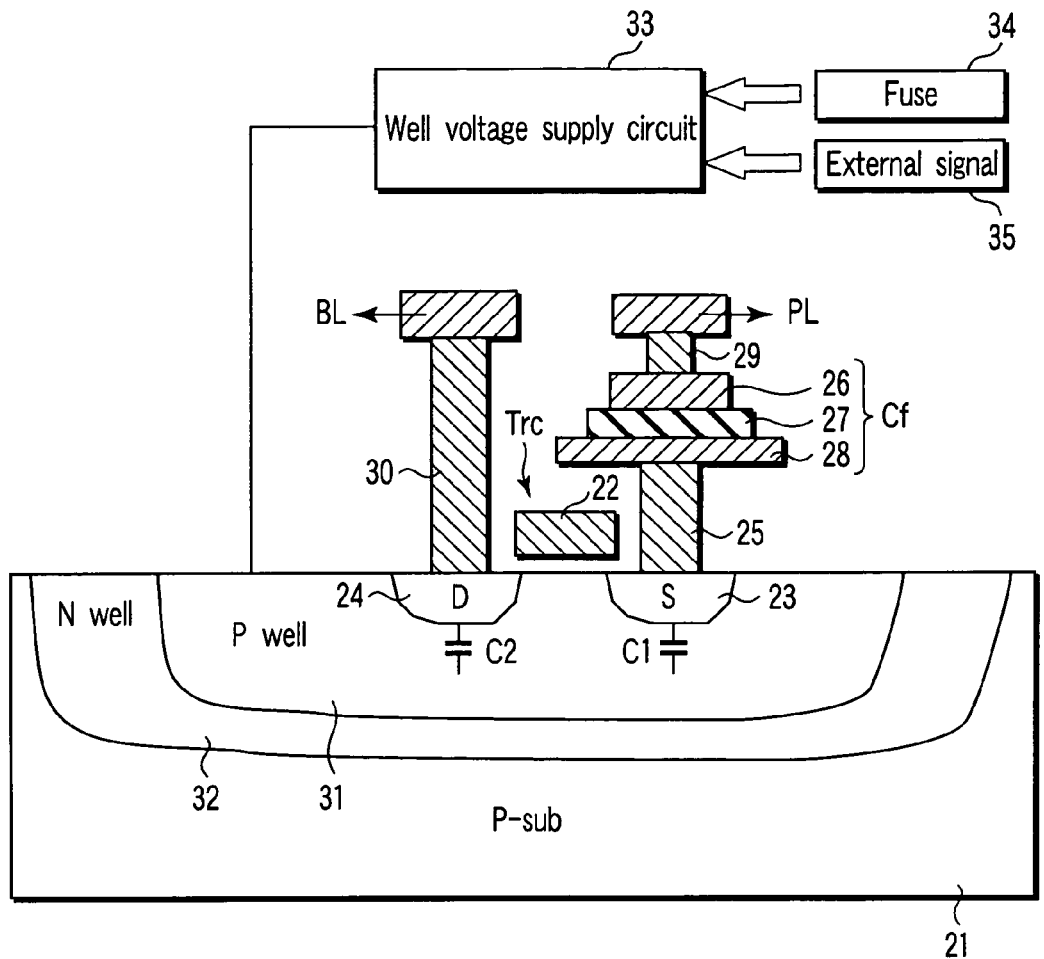
FIG. 5 is a schematic sectional view showing a semiconductor integrated circuit device according to the second embodiment of the present invention.
Figure 6:
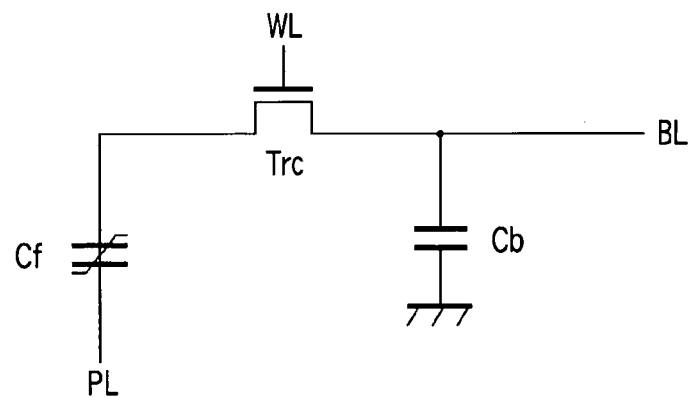
FIG. 6 is a schematic circuit diagram showing a semiconductor integrated circuit device according to prior art.
Figure 7:
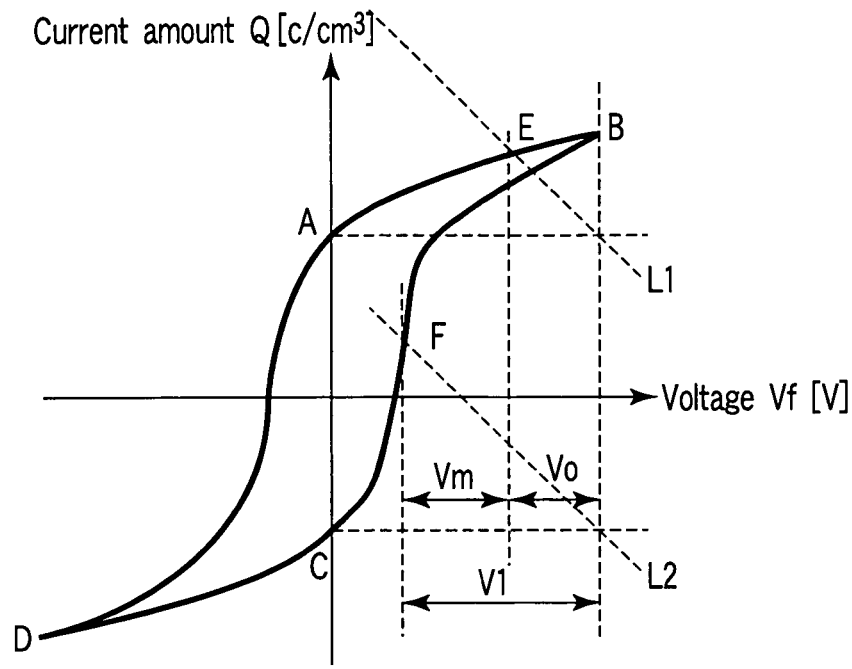
FIG. 7 is a graph showing the hysteresis characteristic of a ferro-electric capacitor according to the prior art.
Figure 8:
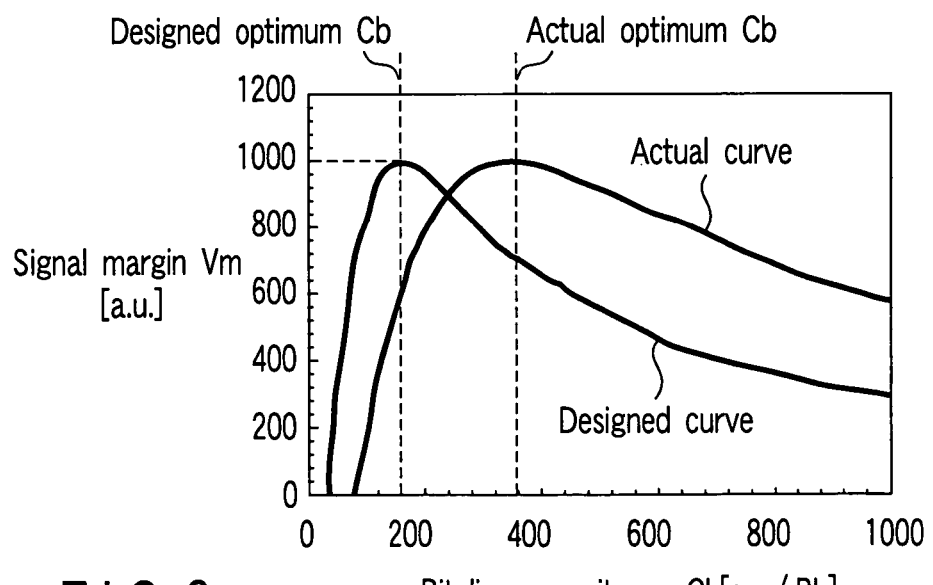
FIG. 8 is a graph showing the relationship between the bit line capacitance and the signal margin according to the prior art.

FIG. 5 is a schematic sectional view of a semiconductor integrated circuit device according to the second embodiment of the present invention. As shown in FIG. 5, a gate electrode 22 and n-type source and drain diffusion layers 23 and 24 are formed on, e.g., a p-type semiconductor substrate 21 to form a cell transistor Trc. A ferro-electric capacitor Cf made of an upper electrode 26, ferro-electric film 27, and lower electrode 28 is connected to the source diffusion layer 23 of the cell transistor Trc through a contact 25. The upper electrode 26 of the ferro-electric capacitor Cf is connected to a plate line PL through a contact 29. The drain diffusion layer 24 of the cell transistor Trc is connected to a bit line BL through a contact 30.

In the semiconductor substrate 21, a p-well 31 is formed adjacent to the source and drain diffusion layers 23 and 24 of the cell transistor Trc to surround them. An n-well 32 is formed adjacent to the p-well 31 to surround it. A double structure of the p-well 31 and n-well 32 is thus formed. The double well structure is formed by the same technique as that used for a DRAM. A well voltage supply circuit 33 is connected to the p-well 31 to supply a variable voltage to it. The well voltage supply circuit 33 is controlled by a fuse 34 or an external signal 35 from a test circuit arranged outside the cell array (e.g., outside the chip) and supplies a negative or positive voltage to the p-well 31.

Generally, when a negative voltage is applied to the p-well 31, capacitances C1 and C2 of the p-n junctions at the source and drain portions of the cell transistor Trc can be decreased. Hence, to adjust the bit line capacitance Cb, a potential with a sign opposite to that of the potential applied to the source and drain diffusion layers 23 and 24 is applied to the well 31 which is adjacent to the source and drain diffusion layers 23 and 24 and surrounds them. A positive voltage may be applied to the p-well 31. In this case, the capacitances C1 and C2 of the p-n junctions at the source and drain portions of the cell transistor Trc can be increased to about 0.7V. In the second embodiment, the additional capacitor C is changed by using such an effect.

A method of adjusting the bit line capacitance Cb by using the double-well structure will be described below. When a double-well structure is used, the bit line capacitance Cb is the sum of the original capacitance of the bit line itself and the capacitances of the p-n junctions. The flow of the bit line capacitance adjusting method according to the second embodiment is almost the same as in the first embodiment shown in FIG. 2.

Before manufacturing of a semiconductor integrated circuit device, design is done in the following way (ST1). When the capacitances C1 and C2 of the p-n junctions should be adjusted by a negative voltage in the device of the second embodiment, the bit line capacitance Cb is maximized without applying any voltage to the p-well 31. The bit line capacitance Cb in this case is designed to be slightly larger than the optimum value predicted from the typical hysteresis shape. The bit line capacitance Cb when the minimum negative voltage (having a maximum absolute value) that can be applied in the circuit design is applied to the p-well 31 is designed to be slightly smaller than the optimum value predicted from the typical hysteresis shape. With this design, the range near the predicted optimum value of the bit line capacitance Cb can be covered.

As in the first embodiment, the change of the bit line capacitance Cb when the potential of the p-well 31 is changed is preferably ±10% (range width: 20%) of the predicted optimum value of the bit line capacitance Cb. In the second embodiment, however, the change rate of the bit line capacitance Cb when the potential of the p-well 31 is changed largely depends on the impurity profile of the p-well 31 or n-well 32, the inter-line capacitance between the bit lines BL, or the structure of the well voltage supply circuit 33. It may therefore be difficult to realize the change rate of ±10%. As a measure, the impurity profiles of the p-well 31 and n-well 32 are optimized.

Next, a semiconductor integrated circuit device having the wells 31 and 32 of the double structure and the well voltage supply circuit 33 is manufactured on the basis of the above design (ST2).

The manufactured product is tested (ST3). In this test, the optimum value of the bit line capacitance Cb, which has varied due to the variation in manufacturing process, is obtained by using the well voltage supply circuit 33.

More specifically, the well voltage supply circuit 33 is driven by the fuse 34 or the external signal 35 from the test circuit. The well voltage supply circuit 33 applies a voltage to the p-well 31 to change the capacitances C1 and C2 of the p-n junctions at the source and drain portions. When the negative voltage applied to the p-well 31 is increased, the capacitances C1 and C2 of the p-n junctions at the source and drain portions can be made small. Hence, the bit line capacitance Cb can also be made small. A positive voltage of only about 0.7V can be applied to the p-well 31. When the positive voltage applied to the p-well 31 is increased, the capacitances C1 and C2 of the p-n junctions at the source and drain portions can be made large. Hence, the bit line capacitance Cb can also be made large. In this way, the magnitude of the voltage applied to the p-well 31 is adjusted, thereby finding the optimum value of the bit line capacitance Cb.

As an index used to find the optimum value of the bit line capacitance Cb, for example, the signal margin (the signal amount of the bit line) Vm between "1" and "0" data or the number of defective products when the bit line capacitance Cb is changed can be used, as in the first embodiment.

On the basis of the information of the optimum value of the bit line capacitance Cb, which is obtained by the above test, the fuse 34 corresponding to the value is disconnected, or control is performed by the external signal 35 to adjust the bit line capacitance Cb (ST4).

According to the second embodiment, the wells 31 and 32 having the double structure are formed. When a variable voltage is applied to the well 31 adjacent to the source and drain diffusion layers 23 and 24, the capacitances C1 and C2 of the p-n junctions can be adjusted. Since the optimum bit line capacitance Cb for each chip can be set after manufacturing the device, the signal margin can be maximized. Hence, the yield and reliability can be increased, as in the first embodiment.

In the second embodiment, no additional circuits (additional capacitors C or transistors Tr) need be prepared for each bit line BL, unlike the first embodiment. For this reason, the increase in chip area due to the additional circuits can be made as small as possible.

The present invention is not limited to the above embodiments, and various changes and modifications can be made without departing from the spirit and scope of the present invention.

In the above embodiments, a general 1T1C-type memory cell is used. However, the present invention is not limited to this. For example, in the above embodiments, a "Series connected TC unit type ferro-electric RAM" may be used, in which the two terminals of a ferro-electric capacitor (C) are connected to the source and drain of a cell transistor (T) to form a unit cell, and a plurality of unit cells are connected in series.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a first transistor which has first a source and drain and a first gate;
   a ferro-electric capacitor which is connected to one of the first source and drain;
   a bit line which is connected to the other of the first source and drain;
   at least one capacitor connected to the bit line; and
   a control circuit which electrically connects the capacitor to the bit line or electrically disconnects the capacitor from the bit line.

2. A device according to claim 1, further comprising a second transistor which has a second source and drain and a second gate, one of the second source and drain being connected to the bit line, the other of the second source and drain being connected to the capacitor, and the second gate being connected to the control circuit.

3. A device according to claim 2, further comprising a fuse which controls a potential of the second gate.

4. A device according to claim 2, further comprising a circuit which is arranged outside a cell array and controls a potential of the second gate.

5. A device according to claim 1, wherein
   the capacitor has a first electrode and a second electrode, and
   the first electrode is connected to the bit line, the second electrode is connected to the control circuit, and a potential of the second electrode is controlled by the control circuit.

6. A semiconductor integrated circuit device comprising:
   a semiconductor substrate of a first conductivity type;
   a cell transistor which is formed on the semiconductor substrate and has source and drain diffusion layers of a second conductivity type and a gate electrode;
   a ferro-electric capacitor which is connected to one of the source and drain diffusion layers;
   a bit line which is connected to the other of the source and drain diffusion layers;
   a first well layer of the first conductivity type, which is formed in the semiconductor substrate to be adjacent to the source and drain diffusion layers and surrounds the source and drain diffusion layers;
   a second well layer of the second conductivity type, which is formed in the semiconductor substrate to be adjacent to the first well layer and surrounds the first well layer; and a voltage supply circuit which is connected to the first well layer to supply a voltage to the first well layer.

7. A device according to claim 6, wherein the voltage supply circuit applies, to the first well layer, a voltage having a sign opposite to that of a voltage applied to the source and drain diffusion layers.

8. A device according to claim 6, further comprising a fuse which controls a potential of the first well layer.

9. A device according to claim 6, further comprising a circuit which is arranged outside a cell array and controls a potential of the first well layer.

10. A bit line capacitance adjusting method using a semiconductor integrated circuit device comprising
a first transistor which has first source and drain and a first gate,
a ferro-electric capacitor which is connected to one of the first source and drain,
a bit line which is connected to the other of the first source and drain,
at least one capacitor connected to the bit line, and
a control circuit which electrically connects the capacitor to the bit line or electrically disconnects the capacitor from the bit line, comprising:
designing the semiconductor integrated circuit device in which a maximum bit line capacitance when all the capacitors are electrically connected to the bit line and a minimum bit line capacitance when all the capacitors are electrically disconnected from the bit line fall within a predetermined range of an optimum value of a bit line capacitance;
manufacturing the semiconductor integrated circuit device on the basis of the design;
testing the semiconductor integrated circuit device to find the optimum value of the bit line capacitance; and
electrically connecting the capacitors to the bit line or disconnecting the capacitors from the bit line so as to obtain the optimum value of the bit line capacitance, by adjusting the bit line capacitance.

11. A method according to claim 10, wherein the predetermined range is ±10% of the optimum value of the bit line capacitance.

12. A method according to claim 10, wherein a signal margin is maximized at the optimum value of the bit line capacitance.

13. A method according to claim 10, wherein
the semiconductor integrated circuit device further comprises a second transistor which has second source and drain and a second gate, one of the second source and drain being connected to the bit line, the other of the second source and drain being connected to the capacitor, and the second gate being connected to the control circuit, and
the capacitor is electrically connected to the bit line by turning on the second gate and the capacitor is electrically disconnected from the bit line by turning off the second gate.

14. A method according to claim 13, wherein the semiconductor integrated circuit device further comprises a fuse which controls a potential of the second gate.

15. A method according to claim 13, wherein the semiconductor integrated circuit device further comprises a circuit which is arranged outside a cell array and controls a potential of the second gate.

16. A method according to claim 10, wherein
the capacitor has a first electrode and a second electrode, and
the first electrode is connected to the bit line, the second electrode is connected to the control circuit, and a potential of the second electrode is controlled by the control circuit.

17. A bit line capacitance adjusting method using a semiconductor integrated circuit device comprising
a semiconductor substrate of a first conductivity type,
a cell transistor which is formed on the semiconductor substrate and has source and drain diffusion layers of a second conductivity type and a gate electrode,
a ferro-electric capacitor which is connected to one of the source and drain diffusion layers,
a bit line which is connected to the other of the source and drain diffusion layers,
a first well layer of the first conductivity type, which is formed in the semiconductor substrate to be adjacent to the source and drain diffusion layers and surrounds the source and drain diffusion layers,
a second well layer of the second conductivity type, which is formed in the semiconductor substrate to be adjacent to the first well layer and surrounds the first well layer, and
a voltage supply circuit which is connected to the first well layer to supply a voltage to the first well layer, comprising:
designing the semiconductor integrated circuit device in which a bit line capacitance when a voltage within an applicable range is applied to the first well layer by the voltage supply circuit falls within a predetermined range of an optimum value of the bit line capacitance;
manufacturing the semiconductor integrated circuit device on the basis of the design;
testing the semiconductor integrated circuit device to find the optimum value of the bit line capacitance; and
causing the voltage supply circuit to supply/stop the voltage to the first well layer so as to obtain the optimum value of the bit line capacitance, by adjusting the bit line capacitance.

18. A method according to claim 17, wherein the voltage supply circuit applies, to the first well layer, a voltage having a sign opposite to that of a voltage applied to the source and drain diffusion layers.

19. A method according to claim 17, wherein the predetermined range is ±10% of the optimum value of the bit line capacitance.

20. A method according to claim 17, wherein a signal margin is maximized at the optimum value of the bit line capacitance.

21. A method according to claim 17, wherein the semiconductor integrated circuit device further comprises a fuse which controls a potential of the first well layer.

22. A method according to claim 17, wherein the semiconductor integrated circuit device further comprises a circuit which is arranged outside a cell array and controls a potential of the first well layer.

* * * * *